(12) United States Patent
Shindo

(10) Patent No.: US 10,833,490 B2
(45) Date of Patent: Nov. 10, 2020

(54) CONTROL BOARD

(71) Applicant: Mitsubishi Electric Corporation, Tokyo (JP)

(72) Inventor: Hisanori Shindo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/495,130

(22) PCT Filed: Jun. 8, 2017

(86) PCT No.: PCT/JP2017/021314
§ 371 (c)(1),
(2) Date: Sep. 18, 2019

(87) PCT Pub. No.: WO2018/225214
PCT Pub. Date: Dec. 13, 2018

(65) Prior Publication Data
US 2020/0091688 A1 Mar. 19, 2020

(51) Int. Cl.
| | |
|---|---|
| *H02B 1/56* | (2006.01) |
| *H02B 1/30* | (2006.01) |
| *H05K 7/20* | (2006.01) |

(52) U.S. Cl.
CPC ............ *H02B 1/565* (2013.01); *H02B 1/30* (2013.01); *H05K 7/20145* (2013.01); *H05K 7/20909* (2013.01)

(58) Field of Classification Search
CPC ............ H02B 1/56; H02B 1/565; H02G 5/10
See application file for complete search history.

(56) References Cited

U.S. PATENT DOCUMENTS 3,364,838 A * 1/1968 Bradley ............... H02B 1/565
                                                                    312/213
5,105,336 A * 4/1992 Jacoby ................ H02B 1/565
                                                                    361/690

(Continued)

FOREIGN PATENT DOCUMENTS

| JP | S5027327 U | 3/1975 |
|---|---|---|
| JP | S5373428 U | 6/1978 |
| JP | H08289422 A | 11/1996 |

(Continued)

OTHER PUBLICATIONS

International Search Report (with English translation) and Written Opinion issued in corresponding International Patent Application No. PCT/JP2017/021314, 9 pages (dated Sep. 12, 2017).

*Primary Examiner* — Zachary Pape
(74) *Attorney, Agent, or Firm* — Buchanan Ingersoll & Rooney PC

(57) ABSTRACT

This control board has buses stored in a bus chamber extending in the vertical direction with respect to a floor surface inside a housing and power is supplied to stored devices from the buses. The control board includes an inlet which is provided on the bus chamber and through which cooling air is taken in, a device inlet provided on the stored devices and opposed to a bus chamber outlet provided on the bus chamber, a device outlet provided on the front side of the stored devices, and a door portion outlet provided on a door on the front side and opposed to the device outlet.

8 Claims, 10 Drawing Sheets

(56) References Cited

U.S. PATENT DOCUMENTS 6,315,656 B1 * 11/2001 Pawlowski ............ H02B 1/565
361/695
2009/0159569 A1    6/2009 Kurogi et al.

FOREIGN PATENT DOCUMENTS

| JP | 2006284130 A | 10/2006 |
| JP | 2009171833 A | 7/2009 |
| JP | 2016111194 A | 6/2016 |
| JP | S58176507 U | 11/2019 |
| WO | 2013046778 A1 | 4/2013 |

* cited by examiner

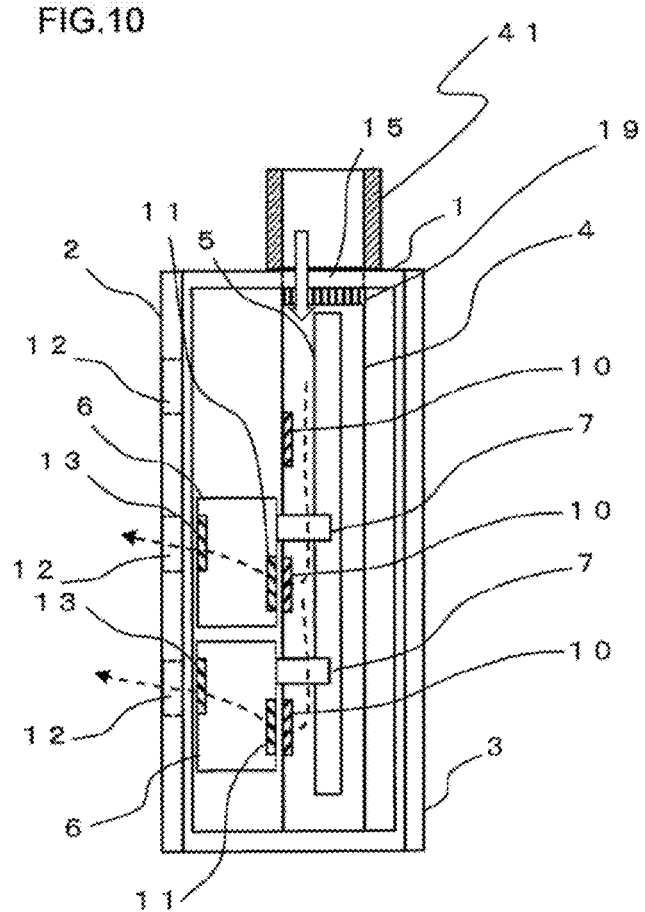

CONTROL BOARD

TECHNICAL FIELD

The present invention relates to a cooling structure of a device stored in a housing of a control board, a distribution board, or the like.

BACKGROUND ART

In a power distribution system in a facility of a factory, a building, or the like, a control board or a distribution board in which a circuit breaker, a switch, and the like are stored is used in order to supply power to devices in the facility. A device that generates a lot of heat, such as an inverter, may be stored in the control board or the distribution board. Increase in the temperature in the board can cause decrease in the life of the stored device or failure thereof. Therefore, the inside of the board is cooled by various methods.

For example, there is a structure in which cooling air is taken in through an inlet provided on a door of the housing of the control board and the cooling air is supplied to a device provided in the housing (see Patent Document 1).

In a data center or the like, there is a structure in which an air supply chamber is provided under a floor, conditioning air is supplied from an air conditioner to the air supply chamber, the air is discharged into a room through an outlet provided on the floor, and air conditioning of the room is performed (see Patent Document 2).

CITATION LIST

Patent Document

Patent Document 1: International Publication WO2013/046778A1
Patent Document 2: Japanese Laid-Open Patent Publication No. 2006-284130

SUMMARY OF THE INVENTION

Problems to be Solved by the Invention

As examples of conventional cooling structures for devices provided inside control boards and distribution boards, as shown in Patent Document 1, air is taken in through an inlet provided on a door surface of a housing, and the air is discharged by a fan provided on the upper portion of the housing, thus compulsory ventilation is performed. Or the air is discharged through a ventilation hole provided on the upper portion of the housing, thus natural ventilation is performed. In the case of cooling the device provided inside the housing by these methods, in particular, by natural ventilation, it is difficult to perform cooling effectively, and this causes a problem that it is necessary to increase the areas of the inlet and the ventilation hole.

In addition, even in the case of employing the cooling method using a ventilation fan, there is a problem that it is difficult to perform cooling effectively unless the inlet, a cooling target, and the ventilation fan are placed in a well-arranged manner.

The present invention has been made to solve the above problems, and an object of the present invention is to provide a cooling structure capable of effectively cooling devices stored in the control board and the distribution board by supplying cooling air to the stored devices while utilizing a bus chamber provided in the control board or the distribution board and extending in the vertical direction.

Means of Solution to the Problems

A control board according to the present invention includes a bus chamber extending in the vertical direction with respect to a floor surface, inside a housing; buses stored inside the bus chamber; stored devices supplied with power from the buses; an inlet which is provided on the bus chamber and through which cooling air is taken in; a device inlet provided on the stored devices and opposed to a bus chamber outlet provided on the bus chamber; a device outlet provided on at least one side of a front side and a back side of the stored devices; and a door portion outlet provided on a door on at least one side of the front side and the back side, and opposed to the device outlet. Further the device outlet and the door portion outlet are located on higher position in the vertical direction than the device inlet.

Effect of the Invention

In a control board configured as described above, it is not necessary to newly provide a duct for introducing air, and therefore the manufacturing cost can be reduced comparing with the case of providing the duct. In addition, cooling air can be directly supplied to a cooled target while utilizing the bus chamber, whereby the cooling effect can be enhanced.

BRIEF DESCRIPTION OF THE DRAWINGS

FIG. 10 is a side sectional view showing a control board according to embodiment 7.

EMBODIMENTS FOR CARRYING OUT THE INVENTION

Embodiment 1

Figure 1:
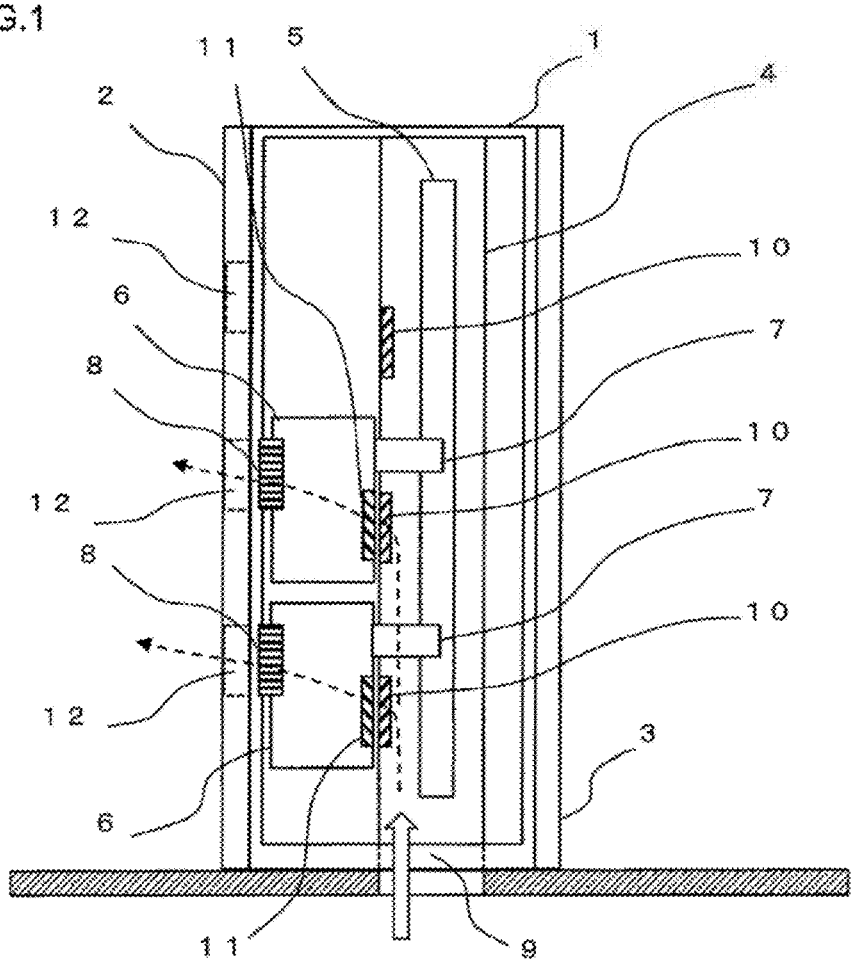
FIG. 1 is a side sectional view showing a control board according to embodiment 1.
Figure 2:
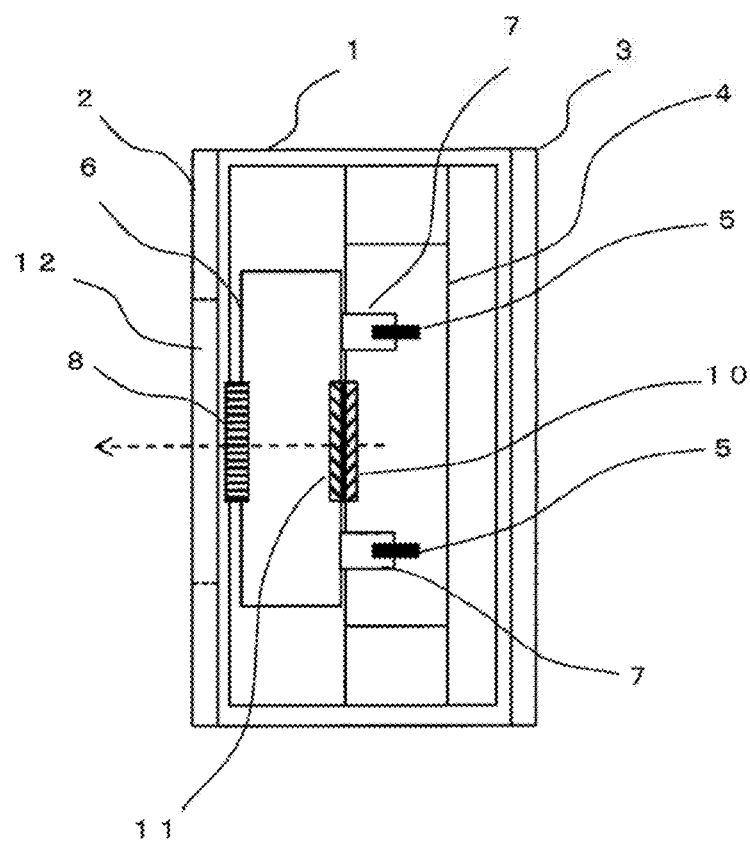
FIG. 2 is a plane sectional view showing the control board according to embodiment 1.

Hereinafter, embodiment 1 will be described with reference to the drawings. In the description below, the case of a control board will be shown. However, the same structure is applied to a distribution board, and in the present invention, the term "control board" has broad meaning including the distribution board as well. FIG. 1 is a side sectional view showing a control board according to embodiment 1 and FIG. 2 is a plane sectional view thereof. In the drawings, a housing 1 includes a bus chamber 4 extending in the vertical direction with respect to the floor surface and extending to a lower part of the control board, and buses 5 are stored inside the bus chamber 4. A lower inlet 9 for taking in cooling air is provided at a lower part of the bus chamber 4. Stored devices 6 are connected to the buses 5 via junctions 7, and power is supplied from the buses 5 through the junctions 7 to the stored devices 6.

Each stored device 6 is provided with a device inlet 11. And the bus chamber 4 is provided with a bus chamber outlet 10 such that, when the stored device 6 is fixed to the housing 1, the bus chamber outlet 10 and the device inlet 11 are matched with each other in position in the vertical direction and are opposed to each other. A fan 8 is provided on the front side of the stored device 6. And a door portion outlet 12 is provided on a front-side door 2 such that the door portion outlet 12 and the fan 8 of the stored device 6 are matched with each other in position in the vertical direction and are opposed to each other. It is noted that the fan 8 and the door portion outlet 12 are located on higher position in the vertical direction than the device inlet 11 in order to discharge air warmed in the stored device 6 to the outside. No device is fixed to the back side of the housing 1, and therefore the housing 1 is closed by a back-side door (or panel) 3.

Figure 3:
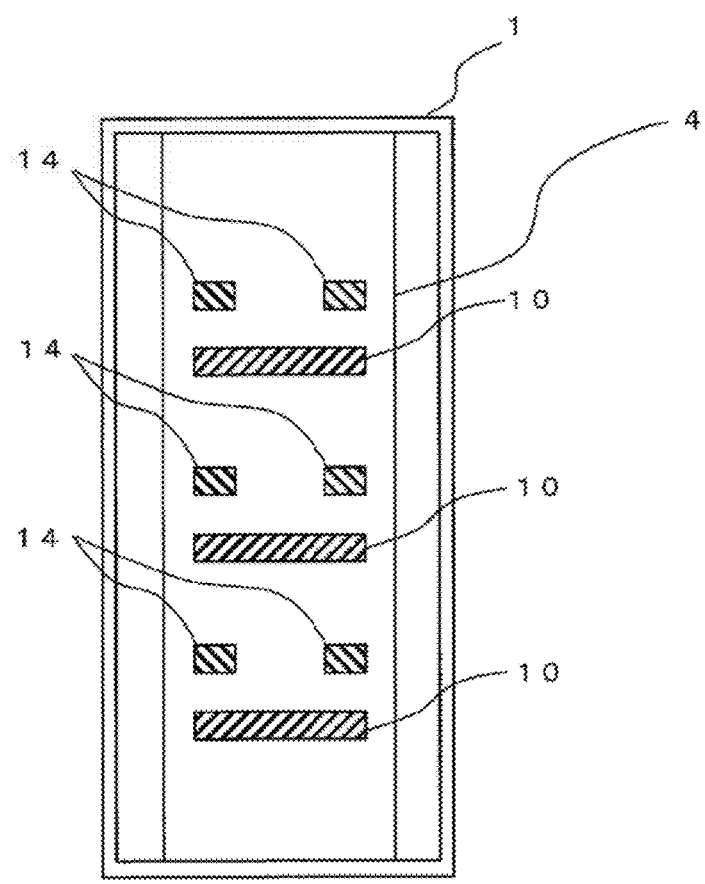
FIG. 3 is a front view showing the control board according to embodiment 1.

FIG. 3 is a front view showing a state in which the door 2 provided on the front side of the control board shown in FIG. 1 and FIG. 2 is opened and the stored devices 6 are removed. The bus chamber 4 joined to the housing 1 has junction penetration openings 14 for connecting the junctions 7 shown in FIG. 1 and FIG. 2 to the buses 5, and the bus chamber 4 has the bus chamber outlets 10 for supplying cooling air to the stored devices 6. In FIG. 3, for simplification of description, the case of providing two junction penetration openings 14 per one stored device 6 is shown. However, the two openings 14 may be integrated into one opening, or three or more openings may be provided. The same is applied to the bus chamber outlet 10 for supplying cooling air to the stored device 6. That is, instead of one bus chamber outlet 10 as shown in FIG. 3, a plurality of bus chamber outlets 10 may be provided per one stored device 6.

Figure 4:
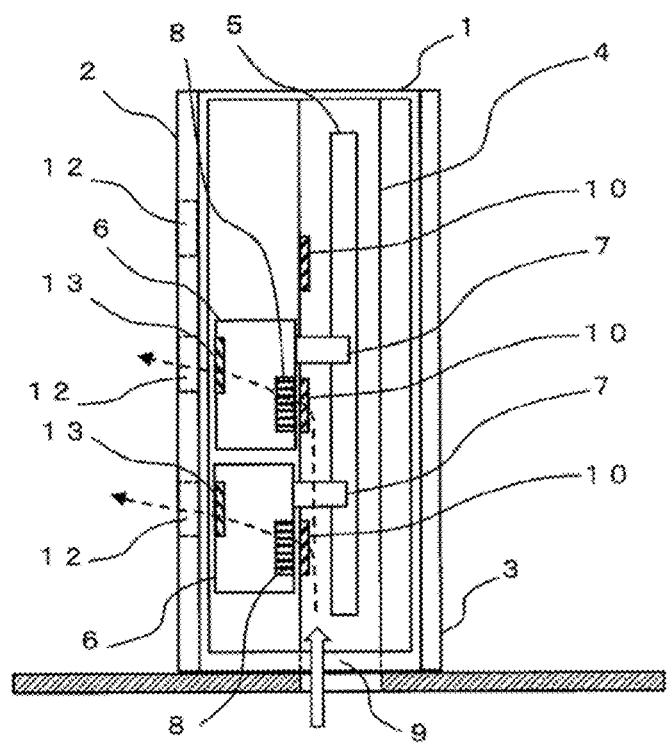
FIG. 4 is a side sectional view showing a control board according to embodiment 2.

Hereinafter, operation in embodiment 1 will be described with reference to the drawings. The lower inlet 9 is connected to a supply port for supplying air from the space under the floor, and cooling air is supplied into the housing 1 by a blower or the like. The air taken into the housing 1 passes through the bus chamber 4 and is sent to each stored device 6 which is a cooled target, through the bus chamber outlet 10 provided on the bus chamber 4 and the device inlet 11 provided on the stored device 6 side. Since the discharge fan 8 is provided in each stored device 6, air (air that has cooled the stored devices 6) warmed in the stored devices 6 is discharged by the discharge fans 8 to the outside of the housing 1 through the door portion outlets 12 provided on the front-side door 2. It is noted that the fans 8 do not necessarily have to be provided on the stored devices 6. That is, when the fans 8 are not provided, only device outlets 13 shown in FIG. 4 are provided. When the fans 8 are provided, the fans 8 are fixed to the device outlets 13. Alternatively, the fans 8 may be provided on the front-side door 2. In this case, the fans 8 are provided on the door portion outlets 12. Further, the fans 8 may be provided on the bus chamber outlets 10. These are also applied to the following embodiments 2 to 7.

Utilizing the bus chamber 4 provided in the vertical direction in the housing 1 as a duct for introducing cooling air eliminates the need of separately providing a duct for introducing cooling air. Thus, when comparing with the case of providing such a duct, the material cost can be reduced and the working time for assembly can be reduced. Further, since the space for placing the duct for introducing air can be eliminated, increase in the size of the control board can be suppressed.

Embodiment 2

Figure 5:
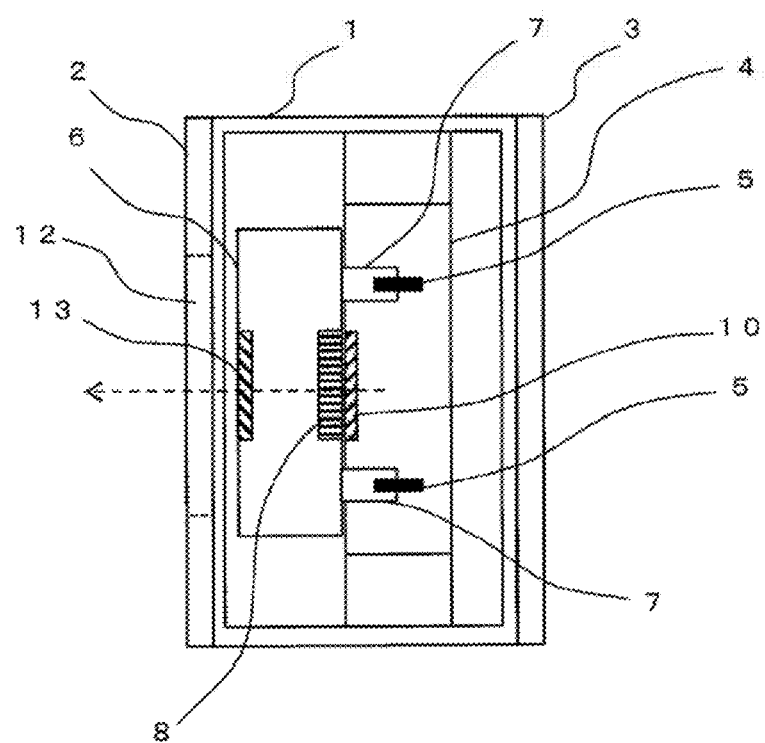
FIG. 5 is a plane sectional view showing the control board according to embodiment 2.

FIG. 4 is a side sectional view showing a control board according to embodiment 2 and FIG. 5 is a plane sectional view thereof. A housing 1 includes a bus chamber 4 extending in the vertical direction with respect to the floor surface, and buses 5 are stored inside the bus chamber 4. A lower inlet 9 for taking in cooling air is provided at a lower part of the bus chamber 4. Stored devices 6 are connected to the buses 5 via junctions 7, and power is supplied from the buses 5 through the junctions 7 to the stored devices 6. Each stored device 6 is provided with an air intake fan 8 at a device inlet 11, and the bus chamber 4 is provided with a bus chamber outlet 10 such that, when the stored device 6 is fixed to the housing 1, the bus chamber outlet 10 and the fan 8 are matched with each other in position in the vertical direction and are opposed to each other. A device outlet 13 is provided on the front side of the stored device 6, and a door portion outlet 12 is provided on a front-side door 2 such that the door portion outlet 12 and the device outlet 13 of the stored device 6 are matched with each other in position in the vertical direction and are opposed to each other. It is noted that the device outlet 13 and the door portion outlet 12 are located on higher position in the vertical direction than the fan 8 in order to discharge air warmed in the stored device 6 to the outside. No device is fixed to the back side of the housing 1, and therefore the housing 1 is closed by a back-side door (or panel) 3. The arrangement, the numbers, and the shapes of junction penetration openings 14 and the bus chamber outlets 10 are the same as those in embodiment 1 (FIG. 3).

Next, operation in embodiment 2 will be described with reference to the drawings. The lower inlet 9 is connected to a supply port for supplying air from the space under the floor, and cooling air is supplied into the housing 1 by a blower or the like. The air taken into the housing 1 passes through the bus chamber 4 and the bus chamber outlets 10 provided on the bus chamber 4, and is sent to each stored device 6 which is a cooled target, by the fan 8 provided on the stored device 6 side. Since the device outlet 13 is provided on the front side of each stored device 6, the air (air that has cooled the stored devices 6) warmed in the stored devices 6 is discharged to the outside of the housing 1 through the device outlets 13 and the door portion outlets 12 provided on the front-side door 2. It is noted that the fans 8 do not necessarily have to be provided on the stored devices 6. That is, in this case, only the device inlets 11 are provided.

The configuration as described above provides the same effect as that in embodiment 1. Further, since the fans 8 are provided near the bus chamber outlets 10, cooling air can be taken into the stored devices 6 more effectively.

Embodiment 3

Figure 6:
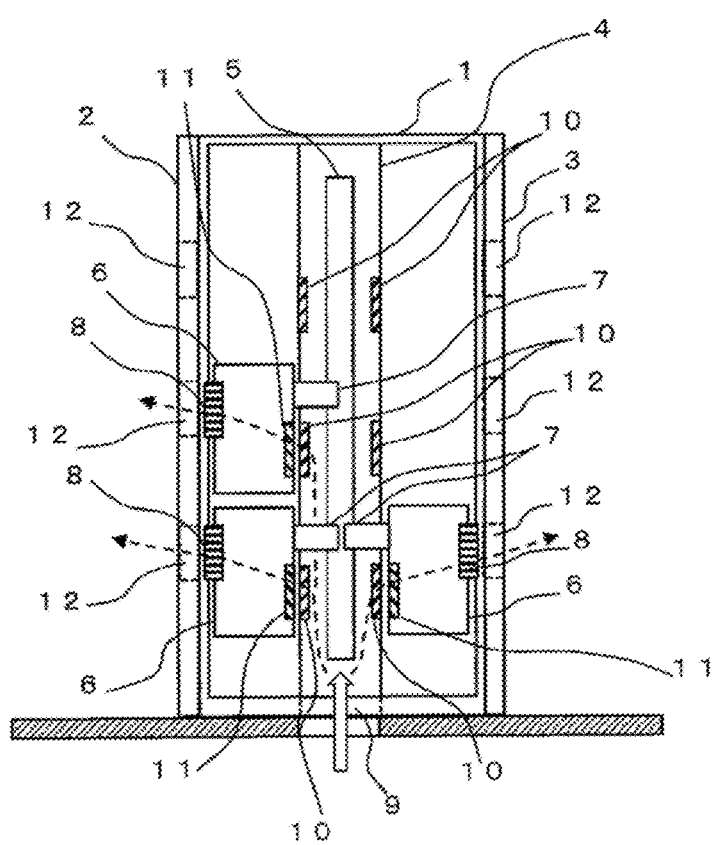
FIG. 6 is a side sectional view showing a control board according to embodiment 3.

FIG. 6 is a side sectional view showing a control board according to embodiment 3. A housing 1 includes a bus chamber 4 extending in the vertical direction with respect to the floor surface, and buses 5 are stored inside the bus chamber 4. A lower inlet 9 for taking in cooling air is provided at a lower part of the bus chamber 4. Stored devices 6 are connected to the buses 5 via junctions 7, and power is supplied from the buses 5 through the junctions 7 to the stored devices 6. Each stored device 6 is provided with a device inlet 11 and the bus chamber 4 is provided with a bus chamber outlet 10 such that, when the stored device 6 is fixed to the housing 1, the bus chamber outlet 10 and the device inlet 11 are matched with each other in position in the vertical direction and are opposed to each other. A fan 8 is provided on the front side of the stored device 6, and a door portion outlet 12 is provided on a front-side door 2 such that the door portion outlet 12 and the fan 8 of the stored device 6 are matched with each other in position in the vertical direction and are opposed to each other. It is noted that the fan 8 and the door portion outlet 12 are located on higher position in the vertical direction than the device inlet 11 in order to discharge air warmed in the stored device 6 to the outside. Further, the stored device 6 is also mounted on the back side of the housing 1 with the same structure as that of the front side. The arrangement, the numbers, and the shapes of junction penetration openings 14 and the bus chamber outlets 10 are the same as those in embodiment 1 (FIG. 3).

Hereinafter, operation in embodiment 3 will be described with reference to FIG. 6. The lower inlet 9 is connected to a supply port for supplying air from the space under the floor, and cooling air is supplied into the housing 1 by a blower or the like. The air taken into the housing 1 passes through the bus chamber 4 and is sent to each stored device 6 which is a cooled target, through the bus chamber outlet 10 provided on the bus chamber 4 and the device inlet 11 provided on the stored device 6 side. Since the discharge fan 8 is provided on each stored device 6, air (air that has cooled the stored devices 6) warmed in the stored devices 6 is discharged by the discharge fans 8 to the outside of the housing 1 through the door portion outlets 12 provided on the front-side door and the back-side door. It is noted that the fans 8 do not necessarily have to be provided on the stored devices 6. The fans 8 may be provided on the front-side door 2 or the back-side door 3.

The configuration as described above provides the same effect as that in embodiment 1.

In the above configuration, the stored devices 6 are mounted on both of the front side and the back side. However, the stored device 6 may be mounted only on the back side.

Embodiment 4

Figure 7:
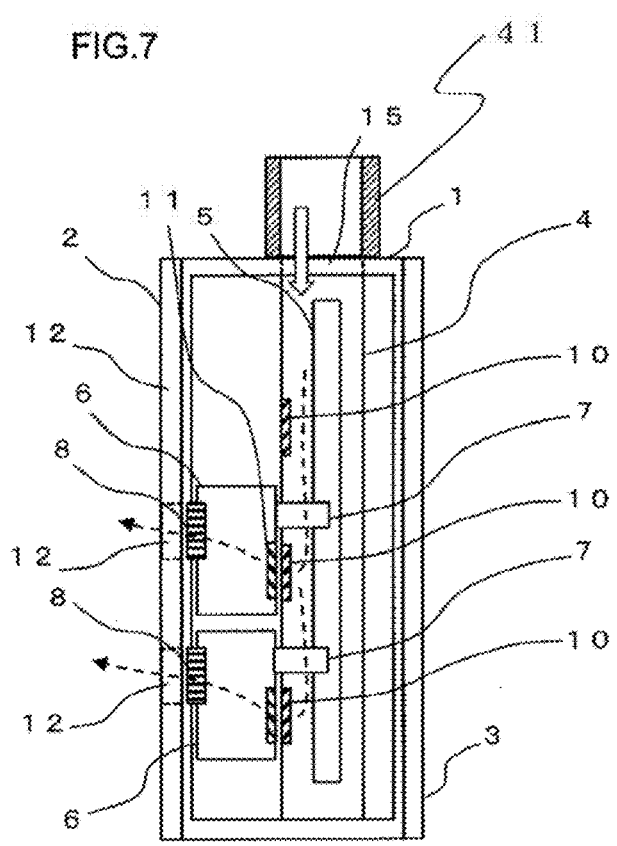
FIG. 7 is a side sectional view showing a control board according to embodiment 4.

Hereinafter, embodiment 4 will be described with reference to drawings. FIG. 7 is a side sectional view showing a control board according to embodiment 4. In FIG. 7, a housing 1 includes a bus chamber 4 extending in the vertical direction with respect to the floor surface, and buses 5 are stored inside the bus chamber 4. An upper inlet 15 for taking in cooling air is provided at an upper part of the bus chamber 4. Stored devices 6 are connected to the buses 5 via junctions 7, and power is supplied from the buses 5 through the junctions 7 to the stored devices 6. Each stored device 6 is provided with a device inlet 11 and the bus chamber 4 is provided with a bus chamber outlet 10 such that, when the stored device 6 is fixed to the housing 1, the bus chamber outlet 10 and the device inlet 11 are matched with each other in position in the vertical direction and are opposed to each other. A fan 8 is provided on the front side of the stored device 6, and a door portion outlet 12 is provided on a front-side door 2 such that the door portion outlet 12 and the fan 8 of the stored device 6 are matched with each other in position in the vertical direction and are opposed to each other. It is noted that the fan 8 and the door portion outlet 12 are located on higher position in the vertical direction than the device inlet 11 in order to discharge air warmed in the stored device 6 to the outside. No device is fixed to the back side of the housing 1, and therefore the housing 1 is closed by a back-side door (or panel) 3. The arrangement, the numbers, and the shapes of junction penetration openings 14 and the bus chamber outlets 10 are the same as those in embodiment 1 (FIG. 3).

Hereinafter, operation in embodiment 4 will be described with reference to FIG. 7. The upper inlet 15 is connected to a supply port 41 for supplying air, and cooling air is supplied into the housing 1 by a blower or the like. The air taken into the housing 1 passes through the bus chamber 4 and is sent to each stored device 6 which is a cooled target, through the bus chamber outlet 10 provided on the bus chamber 4 and the device inlet 11 provided on the stored device 6 side. Since the discharge fan 8 is provided on each stored device 6, air (air that has cooled the stored devices 6) warmed in the stored devices 6 is discharged by the discharge fans 8 to the outside of the housing 1 through the door portion outlets 12 provided on the front-side door 2. It is noted that the fans 8 do not necessarily have to be provided on the stored devices 6. The fans 8 may be provided on the front-side door 2.

The configuration as described above provides the same effect as that in embodiment 1.

In the configuration shown in FIG. 7, the stored device 6 may be further fixed to the back side as shown in FIG. 6.

Embodiment 5

Figure 8:
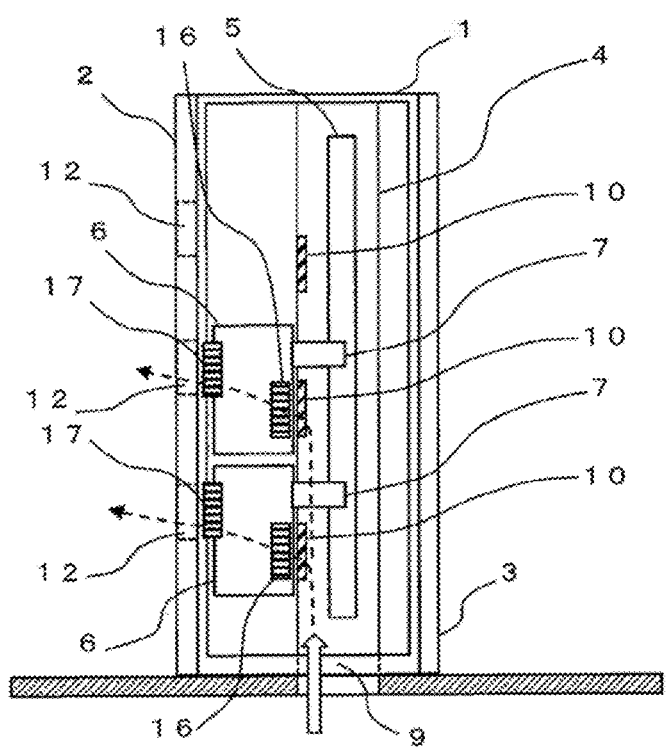
FIG. 8 is a side sectional view showing a control board according to embodiment 5.

FIG. 8 is a side sectional view showing a control board according to embodiment 5. In the drawing, a housing 1 includes a bus chamber 4 extending in the vertical direction with respect to the floor surface and extending to a lower pact of the control board, and buses 5 are stored inside the bus chamber 4. A lower inlet 9 for taking in cooling air is provided at a lower part of the bus chamber 4. Stored devices 6 are connected to the buses 5 via junctions 7, and power is supplied from the buses 5 through the junctions 7 to the stored devices 6. Each stored device 6 is provided with an intake fan 16 and the bus chamber 4 is provided with a bus chamber outlet 10 such that, when the stored device 6 is fixed to the housing 1, the bus chamber outlet 10 and the intake fan 16 are matched with each other in position in the vertical direction and are opposed to each other.

A discharge fan 17 is provided on the front side of the stored device 6, and a door portion outlet 12 is provided on a front-side door 2 such that the door portion outlet 12 and the discharge fan 17 of the stored device 6 are matched with each other in position in the vertical direction and are opposed to each other. It is noted that the discharge fan 17 and the door portion outlet 12 are located on higher position in the vertical direction than the intake fan 16 in order to discharge air warmed in the stored device 6 to the outside. No device is fixed to the back side of the housing 1, and therefore the housing 1 is closed by a back-side door (or panel) 3. The arrangement, the numbers, and the shapes of junction penetration openings 14 and the bus chamber outlets 10 are the same as those in embodiment 1 (FIG. 3).

Next, operation in embodiment 5 will be described with reference to FIG. 8. The lower inlet 9 is connected to a supply port for supplying air from the space under the floor, and cooling air is supplied into the housing 1 by a blower or the like. The air taker, into the housing 1 passes through the bus chamber 4 and the bus chamber outlets 10 provided on the bus chamber 4, and is sent to each stored device 6 which is a cooled target, by the intake fan 16 provided on the stored device 6 side. Since the discharge fan 17 is provided on the front side of each stored device 6, the air (air that has cooled the stored devices 6) warmed in the stored devices 6 is discharged to the outside of the housing 1 through the door portion outlets 12 provided on the front-side door 2. It is noted that the discharge fans 17 do not necessarily have to be provided on the stored devices 6. The discharge fans 17 may be provided on the front-side door 2.

The configuration as described above provides the same effect as that in embodiment 1. In addition, providing both of the intake fan 16 and the discharge fan 17 can further enhance the cooling effect.

Embodiment 6

Figure 9:
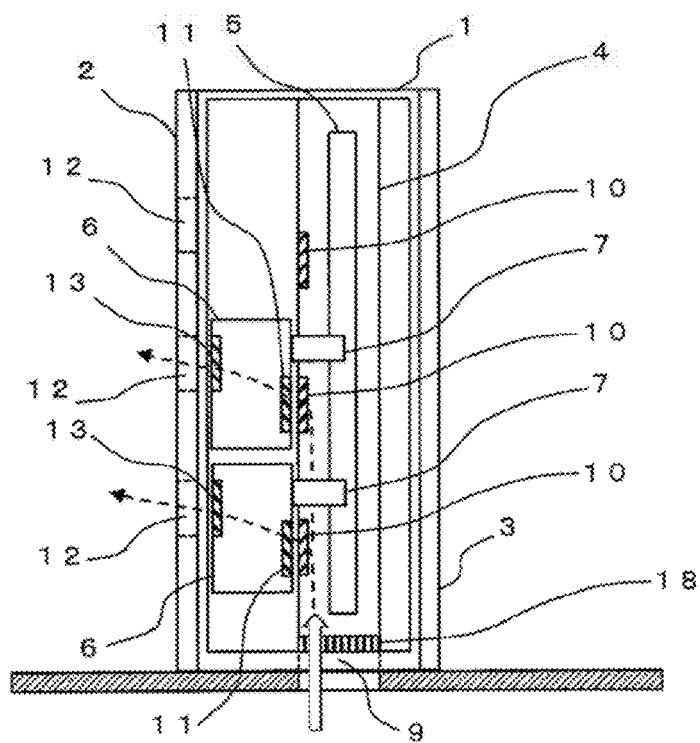
FIG. 9 is a side sectional view showing a control board according to embodiment 6.

FIG. 9 is a side sectional view showing a control board according to embodiment 6. In FIG. 9, a housing 1 includes a bus chamber 4 extending in the vertical direction with respect to the floor surface and extending to a lower part of the control board, and buses 5 are stored inside the bus chamber 4. A lower intake fan 18 and a lower inlet 9 for taking in cooling air are provided on a lower part of the bus chamber 4. Stored devices 6 are connected to the buses 5 via junctions 7, and power is supplied from the buses 5 through the junctions 7 to the stored devices 6. Each stored device 6 is provided with a device inlet 11 and the bus chamber 4 is provided with a bus chamber outlet 10 such that, when the stored device 6 is fixed to the housing 1, the bus chamber outlet 10 and the device inlet 11 are matched with each other in position in the vertical direction and are opposed to each other.

A device outlet 13 is provided on the front side of the stored device 6, and a door portion outlet 12 is provided on a front-side door 2 such that the door portion outlet 12 and the device outlet 13 of the stored device 6 are matched with each other in position in the vertical direction and are opposed to each other. It is noted that the device outlet 13 and the door portion outlet 12 are located on higher position in the vertical direction than the device inlet 11 in order to discharge air warmed in the stored device 6 to the outside. No device is fixed to the back side of the housing 1, and therefore the housing 1 is closed by a back-side door (or panel) 3.

The arrangement, the numbers, and the shapes of junction penetration openings 14 and the bus chamber outlets 10 are the same as those in embodiment 1 (FIG. 3).

Hereinafter, operation in embodiment 6 will be described with reference to FIG. 9. The lower inlet 9 is connected to a supply port for supplying air from the space under the floor, and cooling air is supplied into the housing 1 by the lower intake fan 18 provided at the lower part. The air taken into the housing 1 passes through the bus chamber 4 and is sent to each stored device 6 which is a cooled target, through the bus chamber outlet 10 provided on the bus chamber 4 and the device inlet 11 provided on the stored device 6 side. Since the device outlet 13 for discharging air is provided on each stored device 6, air (air that has cooled the stored devices 6) warmed in the stored devices 6 passes through the device outlets 13 and the door portion outlets 12 provided on the front-side door 2, and air is discharged to the outside of the housing 1.

The configuration as described above provides the same effect as that in embodiment 1. Further, since the intake fan can be formed by only the lower intake fan 18, the structure of the stored device 6 can be simplified and power consumption of the stored device 6 can be suppressed.

In the above description, the example in which only the lower intake fan 18 is provided as a fan has been shown. However, the fan may be provided on the device inlet 11, the device outlet 13, the door portion outlet 12, and/or the bus chamber outlet 10. That is, in embodiments 1 to 3, 5, 6, the fan can be provided on at least any one location of the device inlet 11, the device outlet 13, the door portion outlet 12, the bus chamber outlet 10, and the lower inlet 9.

Embodiment 7

Hereinafter, embodiment 7 will be described with reference to a drawing. FIG. 10 is a side sectional view showing a control board according to embodiment 7. In FIG. 10, a housing 1 includes a bus chamber 4 extending in the vertical direction with respect to the floor surface and extending to a lower part of the control board, and buses 5 are stored inside the bus chamber 4. An upper intake fan 19 and an upper inlet 15 for taking in cooling air are provided at an upper part of the bus chamber 4. Stored devices 6 are connected to the buses 5 via junctions 7, and power is supplied from the buses 5 through the junctions 7 to the stored devices 6. Each stored device 6 is provided with a device inlet 11 and the bus chamber 4 is provided with a bus chamber outlet 10 such that, when the stored device 6 is fixed to the housing 1, the bus chamber outlet 10 and the device inlet 11 are matched with each other in position in the vertical direction and are opposed to each other.

A device outlet 13 is provided on the front side of the stored device 6, and a door portion outlet 12 is provided on a front-side door 2 such that the door portion outlet 12 and the device outlet 13 of the stored device 6 are matched with each other in position in the vertical direction and are opposed to each other. It is noted that the device outlet 13 and the door portion outlet 12 are located on higher position in the vertical direction than the device inlet 11 in order to discharge air warmed in the stored device 6 to the outside. No device is fixed to the back side of the housing 1, and therefore the housing 1 is closed by a back-side door (or panel) 3.

The arrangement, the numbers, and the shapes of junction penetration openings 14 and the bus chamber outlets 10 are the same as those in embodiment 1 (FIG. 3).

Hereinafter, operation in embodiment 7 will be described with reference to FIG. 10. The upper inlet 15 is connected to a supply port 41 for supplying air, and cooling air is supplied into the housing 1 by the upper intake fan 19 provided at the upper part. The air taken into the housing 1 passes through the bus chamber 4 and is sent to each stored device 6 which is a cooled target, through the bus chamber outlet 10 provided on the bus chamber 4 and the device inlet 11 provided on the stored device 6 side. Since the device outlet 13 for discharging air is provided on each stored device 6, air (air that has cooled the stored devices 6) warmed in the stored devices 6 passes through the device outlets 13 and the door portion outlets 12 provided on the front-side door 2, and air is discharged to the outside of the housing 1.

The configuration as described above provides the same effect as that in embodiment 1. Further, since it is required to provide only the upper intake fan 19 as an intake fan, the structure of the stored device 6 can be simplified and power consumption of the stored device 6 can be suppressed.

In the above description, the example in which only the upper intake fan 19 is provided as a fan has been shown. However, the fan may be provided on the device inlet 11, the device outlet 13, the door portion outlet 12, and/or the bus chamber outlet 10. That is, in embodiments 4, 7, the fan can be provided on at least any one location of the device inlet 11, the device outlet 13, the door portion outlet 12, the bus chamber outlet 10, and the upper inlet 15.

It is noted that the present invention is not limited to the configurations described in the above embodiments, and each embodiment may be modified or eliminated within the scope of the present invention.

In FIG. 1 to FIG. 10, the same reference characters denote the same or corresponding parts.

The invention claimed is:

1. A control board comprising:
    a bus chamber extending in the vertical direction with respect to a floor surface, inside a housing;
    buses stored inside the bus chamber;
    stored devices supplied with power from the buses;
    an inlet which is provided at an upper part of the bus chamber and through which cooling air is taken in;
    a device inlet provided on the stored devices and opposed to a bus chamber outlet provided on the bus chamber;
    a device outlet provided on at least one side of a front side and a back side of the stored devices; and
    a door portion outlet provided on a door on at least one side of the front side and the back side, and opposed to the device outlet, wherein
    the device outlet and the door portion outlet are located on higher position in the vertical direction than the device inlet.

2. The control board according to claim 1, wherein the bus chamber outlet and the device inlet are matched with each other in position in the vertical direction.

3. The control board according to claim 2, wherein the device outlet and the door portion outlet are matched with each other in position in the vertical direction.

4. The control board according to claim 3, wherein a fan is provided on at least any one of the device inlet, the device outlet, the door portion outlet, the bus chamber outlet, and the inlet.

5. The control board according to claim 2, wherein a fan is provided on at least any one of the device inlet, the device outlet, the door portion outlet, the bus chamber outlet, and the inlet.

6. The control board according to claim 1, wherein the device outlet and the door portion outlet are matched with each other in position in the vertical direction.

7. The control board according to claim 6, wherein a fan is provided on at least any one of the device inlet, the device outlet, the door portion outlet, the bus chamber outlet, and the inlet.

8. The control board according to claim 1, wherein a fan is provided on at least any one of the device inlet, the device outlet, the door portion outlet, the bus chamber outlet, and the inlet.

* * * * *